WAVE AMPLITUDE CONTROL HIGH-Q LOAD

Filed March 20, 1953

INVENTORS
LLOYD P. GARNER
& WILLIAM N. PARKER
BY Charles H. Brown
ATTORNEY 2,733,340

WAVE AMPLITUDE CONTROL FOR HIGH-Q LOAD

Lloyd Preston Garner and William Nelson Parker, Lancaster, Pa., assignors to Radio Corporation of America, a corporation of Delaware Application March 20, 1953, Serial No. 343,642

11 Claims. (Cl. 250—36)

The invention relates to high frequency wave translation, and it particularly pertains to means for stabilizing the amplitude of a high frequency wave translated by a cavity resonator of relatively high figure of merit (high-Q).

In some applications of electronic high-frequency wave translating circuits, the load consists of a high-Q cavity resonator circuit. The oscillation amplitude must be held constant within close limits even though the loading on the cavity resonator and translating circuit varies during operation. Voltage regulating means usually employed with vacuum tube amplifiers and generators are dependent on the amplitude. In a high-Q circuit, the amplitude changes slowly because of the large amount of energy stored in the cavity resonator. The output of the generator supplying energy to the cavity resonator is a function of the load and it is desired to control the generator output as load conditions vary. As a result of sluggishness, there is a considerable delay in changing the output of the generator supplying energy to the cavity resonator to meet the new load conditions. Consequently, at the output of the generator the oscillation amplitude varies appreciably as the load changes because the sluggishness of the cavity resonator is reflected into the generator through the amplitude control means.

It is an object of the invention to provide an improved generator control system of a high-Q load element to render the generator output directly and immediately responsive to changes in the load element.

It is another object of the invention to minimize oscillation amplitude changes resulting from variations in a high-Q load element.

It is a further object of the invention to provide an improved system whereby the generator output current is proportional to the power required by a changing high-Q load.

It is yet a further object of the invention to provide an improved constant amplitude system having high efficiency for use with a high-Q load.

The objects of the invention are achieved by controlling the translating circuit radio frequency (R. F.) current output by modulating the applied voltages according to a control signal proportional to the side-frequency response of the high-Q cavity resonator. The side-frequency response of the high-Q cavity resonator depends upon the selectivity and, in turn, upon the resistance loading. The side-frequency response is measured by first generating side frequencies by amplitude modulation of the radio frequency translating circuit, and subsequently, rectifying a sample of the cavity resonator output signal containing both carrier and side frequencies. This rectified signal is demodulated to derive the control signal from the side frequencies and this control signal is applied to the generator feeding the cavity resonator.

The invention will be described with reference to the specific embodiment, given by way of example only, shown in the accompanying drawing forming a part of the specification and in which.

Figures 1, 2:
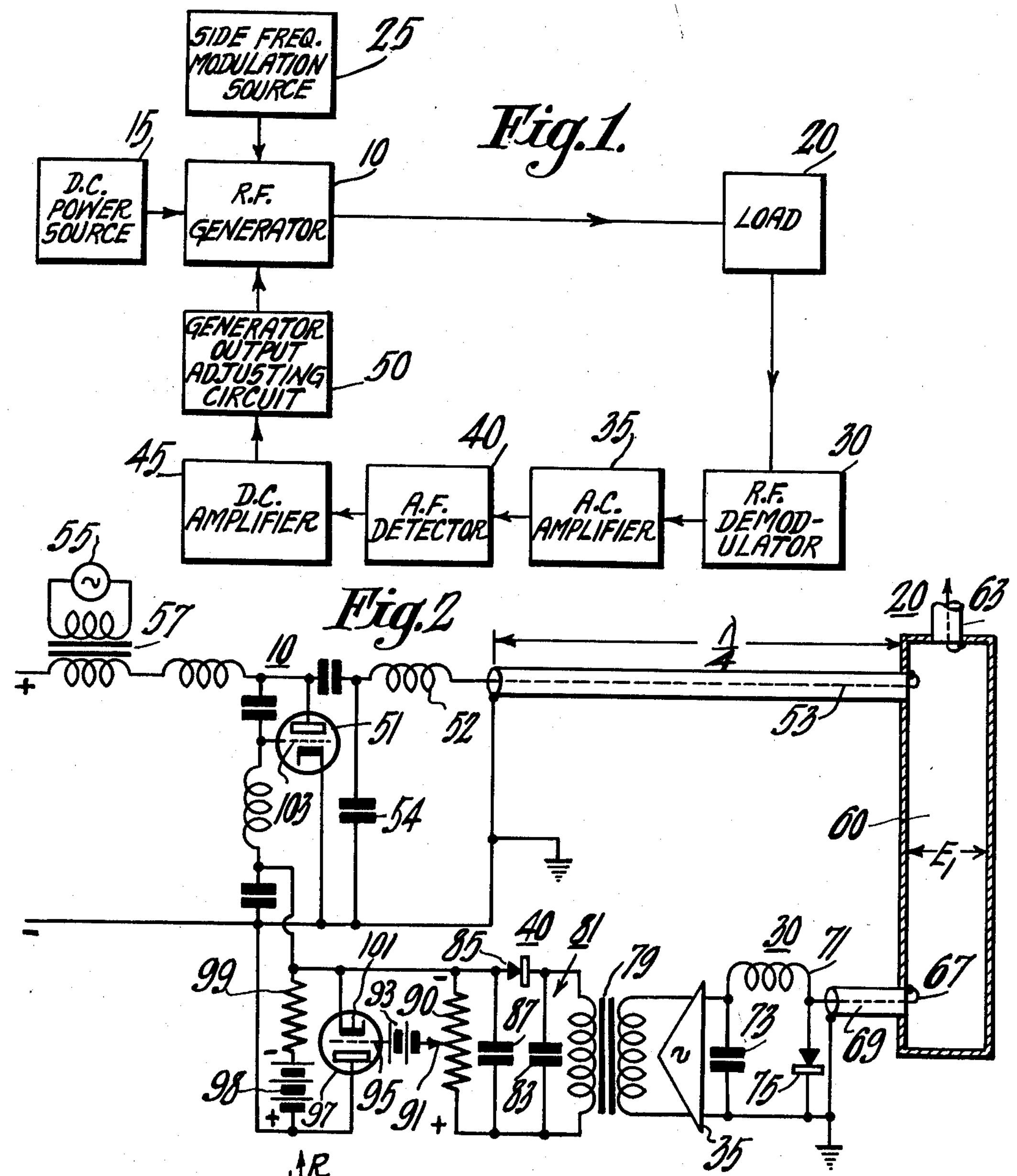
Fig. 1 is a functional diagram of an amplitude control system according to the invention.
Fig. 2 is a schematic diagram of one embodiment of the invention as suggested in Fig. 1.

Referring to the drawings in more detail, Fig. 1 shows an R. F. generator 10 operating from a D. C. power source 15 and supplying substantially constant frequency R. F. power to a load element 20. The R. F. output of the generator 10 is amplitude modulated at a frequency considerably removed from the frequency of the generator 10. This modulation may be accomplished by superimposing some low frequency from a suitable modulation source 25 upon the direct operating potential obtained from the source 15. A sample of the energy obtained from the load 20 is applied to an R. F. demodulator 30. The demodulated low frequency signal is proportional to the amplitude of the side-frequencies and is amplified, if necessary, in an A. C. amplifier 35. Thereafter, the low frequency signal is subjected to a detection process in an A. F. detector 40. The resultant detected D. C. voltage is amplified, if necessary, in a D. C. amplifier 45 and applied to generator output adjusting circuit 50. The output of the adjusting circuit is applied to the R. F. generator 10 in feedback fashion to maintain the output amplitude of the generator 19 substantially constant.

In the arrangement shown in Fig. 2 the R. F. generator 10 includes a vacuum tube 51 connected to a tank circuit comprising an inductor 52 and a capacitor 54 tuned to the operating carrier frequency. R. F. power is applied through a transmission line 53 to the load element 20 comprising a high-Q cavity resonator 60 which is coupled by a transmission line stub 63 to an antenna or other utilization device (not shown). Although not necessary, the feed transmission line 53 is preferably a quarter wavelength, or an odd multiple thereof long at the operating frequency. The transmission line 53 then acts as series resistance in the tank circuit and, due to the transformer effect on the line, the high shunt impedance of the cavity resonator 60 at one end of the line is reflected as a low value at the other end of the line 53 in series with the tank circuit 52—54 to afford a suitable load for tube 51. The R. F. output of the generator 10 is amplitude modulated at a side-frequency $f_2$ considerably below the generator R. F. frequency $f_0$ by superimposing some low frequency power from a modulation source 55 through transformer 57 upon the D. C. input as shown. A sample of the cavity voltage $E_1$ is induced in a coupling loop 67 and carried by a sampling transmission line 69 to the R. F. demodulator 30 comprising a filter inductor 71 and a filter capacitor 73, and a shunt rectifier 75. The sampling transmission line 69 may be any convenient length. The rectified low frequency output will be proportional to the amplitude of the side-frequencies and may be suitably amplified in the A. C. amplifier 35 of known type and transformed by the transformer 79 to a voltage $E_2$. The A. C. voltage $E_2$ may then be filtered from extraneous low frequencies by a selective network 81 comprising the secondary winding of the transformer 79 and a shunt capacitor 83 and then rectified by an A. F. detector in the form of series connected semi-conductor rectifier 85. The rectified D. C. output $E_3$ across a further filter capacitor 87 may be amplified by a D. C. amplifier, if necessary, and used as a signal to control an adjustable bias voltage supply to furnish part of the D. C. grid bias for tube generator 51.

As shown in Fig. 2, the audio signal derived by the rectifier 85 develops a D. C. voltage $E_3$ across a resistor in the form of a potentiometer 90. An appropriate fraction of the controlling voltage $E_3$, as determined by the setting of a tap 91 on the potentiometer 90 is impressed through a bias battery 93 upon the grid 95 of a triode 97 causing the anode current drawn from a supply battery 98 by the triode 97 to increase with an increase in audio signal thus signifying an increased loading on the cavity resonator 60. Sufficient amplitude is obtained in the output of the triode 97 in the circuit shown to eliminate the need for any separate D. C. amplifier as suggested by the functional diagram of Fig. 1. If such an amplifier is necessary, almost any one of the known circuits will be satisfactory as long as the proper polarity of signal is maintained. The increased current through the tube 97 and the associated grid resistor 99 causes the potential of the cathode 101 and hence the bias normally applied to the grid 103 of the generator tube 51 by the bias battery 98 to become less negative. This, in turn, permits a greater current to flow during the R. F. pulses of the tube 51 with a resultant increased output, as in the conventional grid-bias modulated transmitter.

Figure 3:
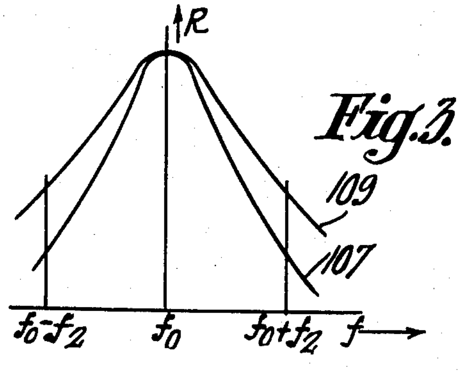
Fig. 3 is a graphical representation of pertinent operating characteristics of the circuit arrangement shown in Fig. 2.

The amplitude of the side-frequencies, hence the control signal voltage $E_3$ depends upon the selectivity of the high-Q cavity resonator 60 and, in general, will be very small compared with the main oscillation or carrier frequency $f_0$. The curves shown in Fig. 3 illustrate the relative amplitude response against frequency for a typical high-Q resonator circuit. The curves 107 and 109 represent the output amplitude, as seen at the rectifier 75 for a constant voltage amplitude in cavity resonator 60 for light and heavy loads, respectively. When the load resistance of the cavity resonator 60 as presented to the transmission line 53 is high, the response curve is quite sharp as shown, and the side-frequency response is low. As the load resistance of the cavity resonator 60 decreases, corresponding to an increase in power demand, the relative response curve is broader and the side-frequency amplitudes are increased. As a consequence, the voltages $E_2$ and $E_3$ increase and operate to decrease the negative bias on grid 103 of the tube 51 thereby increasing the R. F. tube output current. The increased output current corresponds to increased power into the high-Q cavity resonator 60 so that the R. F. energy circulating in the cavity resonator need not change. As a consequence, the R. F. voltage $E_1$ across the cavity resonator 60 remains substantially constant.

The control system as shown is responsive to changes in load resistance and may be considered to be made up of two functional components. The first component detects changes in load resistance while the second modifies the generator R. F. current output. The method of detecting changes in load resistance is an essential part of the invention. Means for modifying or controlling generator output are well known in the art and may take various forms other than the grid bias modulation arrangement shown. However, it is considered preferable to control the generator output current by changing the peak positive grid excursion because the generator then always operates at relatively high anode efficiency. If, on the other hand, the output current were increased by raising the direct anode voltage, with anode A. C. voltage and peak positive grid excursion constant, the anode dissipation would increase considerably because current flow would take place at higher instantaneous anode voltages. As a consequence, the anode efficiency would be lowered.

The generator 10 may be a power amplifier or other R. F. translating circuit instead of the self-excited oscillator as shown. Also, a variety of oscillator circuits may be used, such as the grounded-grid, tuned-grid-tuned plate, and so forth. The arrangement illustrated is only one of several possible methods. It may be preferable to achieve the modulation necessary for side-frequency generation by super-imposing the $f_2$ modulation on the grid bias. In the case of a power-amplifier, the amplitude of the driver R. F. output could be appropriately modulated at frequency $f_2$ by any one of several methods. Regardless of the modification used, the principle of generator output control in response to load-circuit selectivity changes and forms the basis of a greatly improved means for maintaining constant R. F. voltage across a cavity resonator or other high-Q load.

It is contemplated that the invention will be most useful with carrier frequencies upwards of 3 mc./s. and side-frequencies in the audible frequency range, for example 50 to 1,000 c./s., although one skilled in the art would no doubt find that a circuit arrangement according to the invention could be designed for operation at other frequencies without departing from the spirit and the scope of the invention.

The invention claimed is:

1. A system for producing substantially constant amplitude wave energy in a circuit element of relatively high figure of merit, including a high frequency wave translating device coupled to said circuit element to apply wave energy thereto, means to amplitude modulate said wave translating device by a wave of frequency removed from the frequency of operation of said device, a demodulator coupled to said circuit element to derive a voltage proportional to the amplitude of said wave, a rectifier circuit coupled to said demodulator to produce a potential proportional to the amplitude of said wave, and means to apply said potential to said wave translating device to maintain the output thereof substantially constant.

2. A system as defined in claim 1 and wherein said circuit element is constituted by a cavity resonator and said wave translating device is constituted by an electron discharge device having an input circuit and an output circuit coupled to said cavity resonator, and said potential applying means is coupled to the input circuit of said electron discharge device.

3. A system as defined in claim 2 and wherein said input circuit of said electron discharge device comprises at least a cathode and a control element, and said potential applying means is applied to said elements to bias one with respect to the other.

4. A circuit arrangement for producing substantially constant amplitude of wave energy, including a radio frequency wave translating electron discharge device, a load device of relatively high figure of merit coupled to said radio frequency wave translating device, means to amplitude modulate said wave translating device by an audio frequency wave, a demodulator coupled to said load device to derive a voltage wave proportional to said audio frequency wave, a rectifier circuit coupled to said demodulator to produce a potential proportional to the amplitude of said audio frequency wave, means to bias said electron discharge device, and further means in circuit with said biasing means and responsive to said potential to vary the bias on said electron discharge device to maintain the output of said radio frequency wave translating device substantially constant.

5. A circuit arrangement for maintaining the amplitude of wave energy in a cavity resonator substantially constant including radio frequency translating apparatus coupled to said cavity resonator and having an electron discharge device including cathode, grid and anode electrodes, means to apply direct operating potential to said apparatus, means in circuit with said means to supply operating potentials to amplitude modulate the output of said apparatus at a given frequency removed from the frequency of operation of said apparatus, a demodulator coupled to said cavity resonator to derive a wave representative of energy of said given frequency, a detector coupled to said demodulator to derive a potential proportional to the amplitude variations of said wave of given frequency, an adjustable bias circuit coupled between said detector and the grid and cathode electrodes of said electron discharge device to vary the grid bias proportional to said potential, thereby to maintain the amplitude of wave energy applied to said cavity resonator substantially constant.

6. A circuit arrangement as defined in claim 5 and wherein said given frequency is lower than said frequency of operation.

7. A circuit arrangement as defined in claim 5 and wherein said derived potential is inversely proportional to the amplitude variations of said wave of given frequency.

8. A circuit arrangement as defined in claim 5 and wherein said demodulator comprises a series circuit includnig an inductor and a capacitor connected across a transmission line coupled to said cavity resonator, said transmission line and said series circuit having component reactance values resonant to said given frequency and a rectifier element shunted across said series circuit.

9. A circuit arrangement as defined in claim 5 and wherein said radio frequency translating apparatus is an oscillator.

10. A circuit arrangement as defined in claim 5 and wherein said adjustable bias circuit comprises an electron discharge system having a cathode coupled to the grid electrode of said electron discharge device, a grid and an anode connected to the cathode electrode of said electron discharge device, and means to apply said potential between the grid and cathode of said electron discharge system.

11. A circuit arrangement as defined in claim 10 and wherein said detector comprises a transformer having one winding coupled to said demodulator and having an output winding, a resistance device having a tapping thereon and a rectifier device connected across said output winding, said tapping being connected to said grid and the junction between said resistor and said rectifier device being connected to the cathode of said electron discharge system.

References Cited in the file of this patent

UNITED STATES PATENTS

| | | |
|---|---|---|
| 2,085,125 | Shaw | June 29, 1937 |
| 2,564,005 | Halpern et al. | Aug. 14, 1951 |